(12) United States Patent
Lee et al.

(10) Patent No.: US 6,351,405 B1
(45) Date of Patent: Feb. 26, 2002

(54) PAD FOR INTEGRATED CIRCUIT DEVICE WHICH ALLOWS FOR MULTIPLE PROBING AND RELIABLE BONDING AND INTEGRATED CIRCUIT DEVICE INCLUDING THE PAD

(75) Inventors: Yong-hee Lee, Seongnam; Kyu-hyung Kwon, Ansan, both of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/594,657

(22) Filed: Jun. 15, 2000

(30) Foreign Application Priority Data

Sep. 16, 1999 (KR) .............................................. 99-39835

(51) Int. Cl.⁷ ................................................. G11C 5/06
(52) U.S. Cl. .......................... 365/63; 365/201; 439/169; 439/219; 439/482
(58) Field of Search ............................ 365/63, 201, 51; 361/767, 808; 439/169, 219, 482

(56) References Cited

U.S. PATENT DOCUMENTS

| 5,506,499 A | | 4/1996 | Puar ........................ 324/158.1 |
| 5,799,021 A | * | 8/1998 | Gheewala .................. 371/22.1 |
| 5,891,745 A | | 4/1999 | Dunaway et al. ............. 438/18 |
| 5,896,039 A | * | 4/1999 | Brannigan et al. .......... 324/763 |
| 5,991,232 A | * | 11/1999 | Matsumura et al. ........ 365/233 |

* cited by examiner

Primary Examiner—Richard Elms
Assistant Examiner—VanThu Nguyen
(74) Attorney, Agent, or Firm—Skjerven Morrill MacPherson LLP; David W. Heid (57) ABSTRACT

An integrated circuit device having a first type of pads with a probing portion and a bonding portion. The integrated circuit device includes a memory cell array, a logic circuit, and a plurality of the first type of pads and a plurality of a second type of pads. The second type of pads are electrically connected to the logic circuit. The first type of pads are electrically connected to the memory cell array and the logic circuit. Only the probing portion of the first type of pads is contacted by probes during testing of the memory cell array, and the bonding portion is used exclusively for attachment of a bond wire to permit connection to an external system.

9 Claims, 6 Drawing Sheets

PAD FOR INTEGRATED CIRCUIT DEVICE WHICH ALLOWS FOR MULTIPLE PROBING AND RELIABLE BONDING AND INTEGRATED CIRCUIT DEVICE INCLUDING THE PAD

BACKGROUND OF THE INVENTION

1. Field of the Invention

The present invention relates to an integrated circuit device, and more particularly, to a merged memory-logic integrated circuit device including a DRAM cell array and a logic circuit.

2. Description of the Related Art

With advances in semiconductor technology, semiconductor devices of the integrated circuit type have been developed, and such integrated circuit devices include, for example, a memory cell array and a logic circuit merged into a single semiconductor device. These integrated circuit devices are referred to as merged memory-logic integrated circuit devices. After a wafer including a plurality of merged memory-logic integrated circuit devices is manufactured, a wafer sort test process is carried out on each of the merged memory-logic integrated circuit devices to test their operation. During the wafer sort test process, testing of the memory cell arrays and logic portions is performed separately. More particularly, one test is performed to determine whether the logic portions operate correctly, and in separate operations the memory cell arrays are tested several times to check their characteristics both before and after repairing the memory cell arrays. During the wafer sort test process, probe tips, which are attached to a probe card to connect a test equipment to the wafer, are placed in contact with a plurality of pads included in a merged memory-logic integrated circuit device. That is, a plurality of pads are probed. Since memory cell arrays are tested several times, the time required to test the memory cell arrays is significant. To minimize the amount of the test time, a plurality of chips are simultaneously tested. In simultaneously probing a plurality of chips, the contact force of the probe tip, as well as the narrow distance between probes can cause problems as a plurality of tests are carried out.

To solve the problems, the distance between probe tips has been increased and the thickness of each probe tip has been increased. A pad, which has been probed, may be damaged which will reduce the strength of the bond between the bond wire and the pad. Therefore, as probe thickness increases, pad area must also increases. To solve the problem of the reduced adhesive strength, U.S. Pat. No. 5,506,499 describes a method of forming and using separate, auxiliary pads between primary pads. During testing of a merged memory-logic integrated circuit device, only the auxiliary pads are probed to test a memory cell array and, after the memory cell array is completely tested, wires are bonded to the primary pads, which have not been probed, and thus have not been damaged from the probing, thereby improving the strength of the bonds to the primary pads.

When the number of primary logic pads is small, forming auxiliary pads between the primary logic pads poses no problem. However, when the number of primary logic pads is large, forming auxiliary pads between the primary logic pads results in undesirable increase of the size of a merged memory-logic integrated circuit device. As the sizes of merged memory-logic integrated circuit devices increase, the production costs are increased.

SUMMARY OF THE INVENTION

To solve the above problems, the present invention provides an integrated circuit device having bonding pads which maintain reliable bonding even after multiple probing during a wafer sort test process.

In accordance with one embodiment of the present invention, an integrated circuit device is provided which comprises: a pad electrically connected to the circuitry of the integrated circuit device, wherein the pad comprises: a probing portion to which probe tips are brought into contact for transmission of a test signal to the circuitry of the integrated circuit device; and a bonding portion for providing electrical connection to the circuitry of the integrated circuit device.

In another embodiment of the present invention, an integrated circuit device is provided which includes a substrate having a memory cell array and a logic circuit, with the integrated circuit device comprising: a logic pad positioned on a surface of said substrate; a test pad positioned on a surface of said substrate; a multiplexer electrically connected to the logic pad, the test pad, the memory cell array and logic circuit, the multiplexer being adapted to receiver control signal having first and second states, said multiplexer responding to receipt of a control signal of said first state to couple the logic pad to the logic circuit, and said multiplexer responding to receipt of a control signal of said second state to couple the test pad to the memory cell array; and a resistor connected to the test pad.

In the integrated circuit of the immediately preceding embodiment, the logic pad comprises a metal layer having a portion positioned above a surface of the substrate, the portion having an area; and wherein said device further includes a conductive line connecting the test pad to the multiplexer, and further wherein a portion of said conductive line is positioned within the area.

In accordance with a further embodiment of the present invention, an integrated circuit device having a memory cell array and a logic circuit is provided, and the integrated circuit device comprises: a logic pad; a test pad; transmitting means electrically connected to the test pad, said transmitting means including an input for receiving a control signal, and said transmitting means including an output for providing thereat a signal received from the test pad when the control signal is activated; and a multiplexer electrically connected to the logic pad, to the transmitting means, to the memory cell array and to the logic circuit, said multiplexer including an input for receiving the control signal, said multiplexer being responsive to receipt of the control signal to transmit a signal received from the logic pad to the logic circuit, and to transmit a signal received from the test pad to the memory cell.

In another embodiment of the invention, a method of manufacturing and testing an integrated circuit device is provided, with the method comprising: providing a pad having a bonding portion and a probing portion; electrically connecting the pad to circuitry of said integrated circuit device; and testing the operation of the electrical circuitry connected to the pad by bringing a probe into contact with only the probing portion of the pad and applying electrical signals to the probe.

According to another embodiment, an integrated circuit device having a memory cell array and a logic circuit is provided, where the integrated circuit device comprises: a first pad electrically connected to the logic circuit; and a second pad electrically connected to the memory cell array and the logic circuit, wherein the second pad comprises: a probing portion to which probe tips are brought into contact for transmission of a test signal for testing the integrated circuit device; and a bonding portion for providing electrical connection to an external system.

BRIEF DESCRIPTION OF THE DRAWINGS

The advantages of the present invention will become more readily apparent by reference to the description below in conjunction with the drawings in which.

DETAILED DESCRIPTION OF THE INVENTION

The present invention is described below with reference to the accompanying drawings, in which preferred embodiments of the invention are shown. This invention may, however, be embodied in many different forms and is not limited to the embodiments set forth herein; rather, the embodiments are provided so that this disclosure will be thorough and complete, and fully convey the concept of the invention to those skilled in the art. The same reference numerals in different drawings represent the same element, and thus after a prior description subsequent descriptions are unnecessary. Moreover, the embodiments set forth herein include their complementary, inverted type embodiments.

Figure 1:
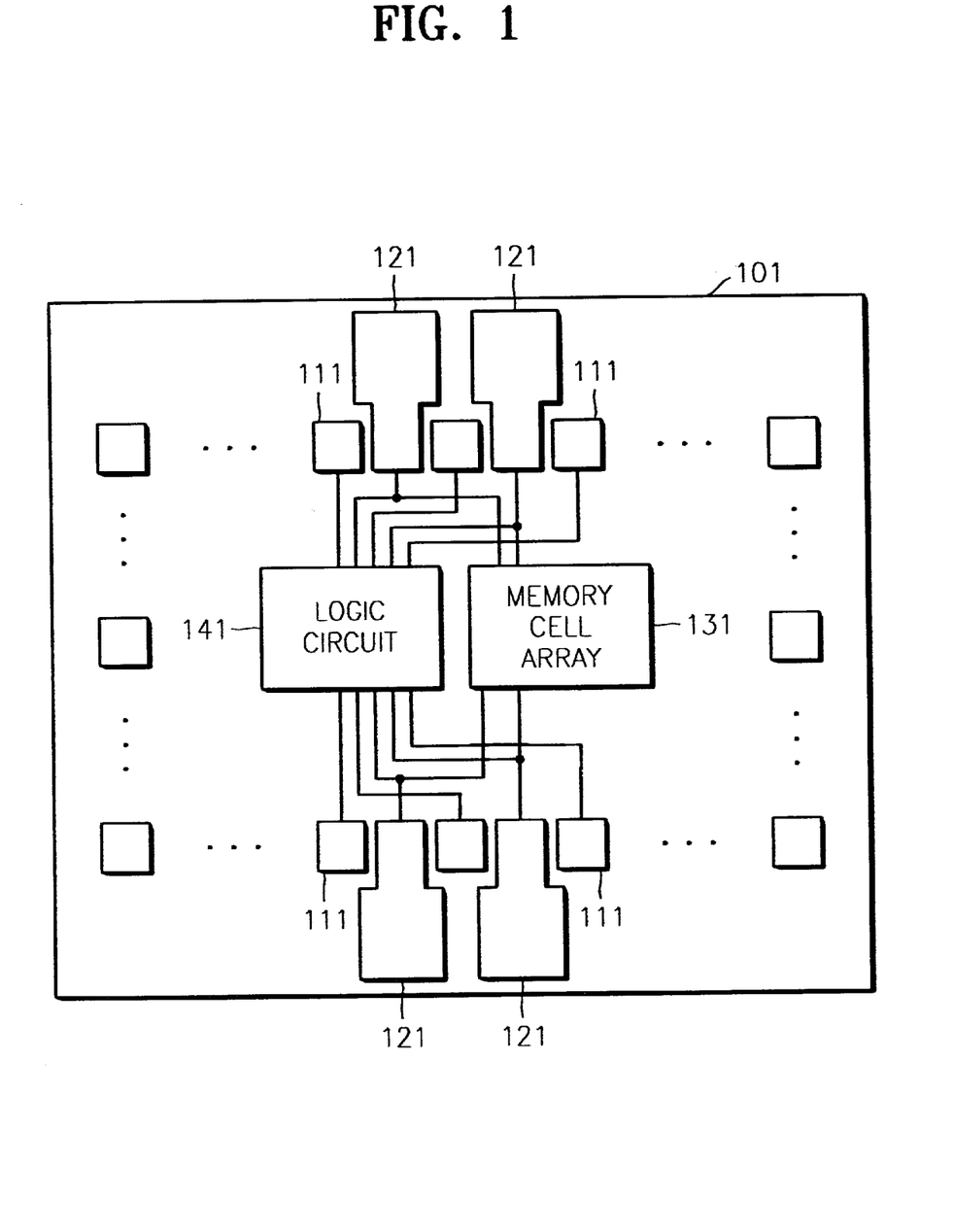
FIG. 1 is a combination block and pictorial diagram of an integrated circuit device according to a first embodiment of the present invention.

Referring to FIG. 1, an integrated circuit device 101 according to an embodiment of the present invention is illustrated and includes a plurality of first pads 111, a plurality of second pads 121, a memory cell array 131 and a logic circuit 141. The first pads 111 are electrically connected to the logic circuit 141, but are not connected to the memory cell array 131. The second pads 121 are electrically connected to both the logic circuit 141 and the memory cell array 131. To selectively connect the second pads 121 to the logic circuit 141 and the memory cell array 131, a multiplexer (not shown) is used. The second pads 121 are connected to the logic circuit 141 during a normal mode of operation and connected to the memory cell array 131 during a test mode, by the multiplexer.

During the test mode, memory testing equipment (not shown) directly accesses the memory cell array 131 via the second pads 121 without passing through the logic circuit 141, thereby reducing the amount of time necessary for testing the memory cell array 131. The first pads 111 and the second pads 121 are alternately arranged. Each of the second pads 121 is made of ductile metal, for example, aluminum or copper alloy, and is composed of a single metal layer or a multi-metal layer. In FIG. 1, the first and second pads 111 and 121 respectively are arranged in a horizontal direction, but they may be arranged in a vertical direction or on in both the vertical and horizontal directions.

Figure 2:
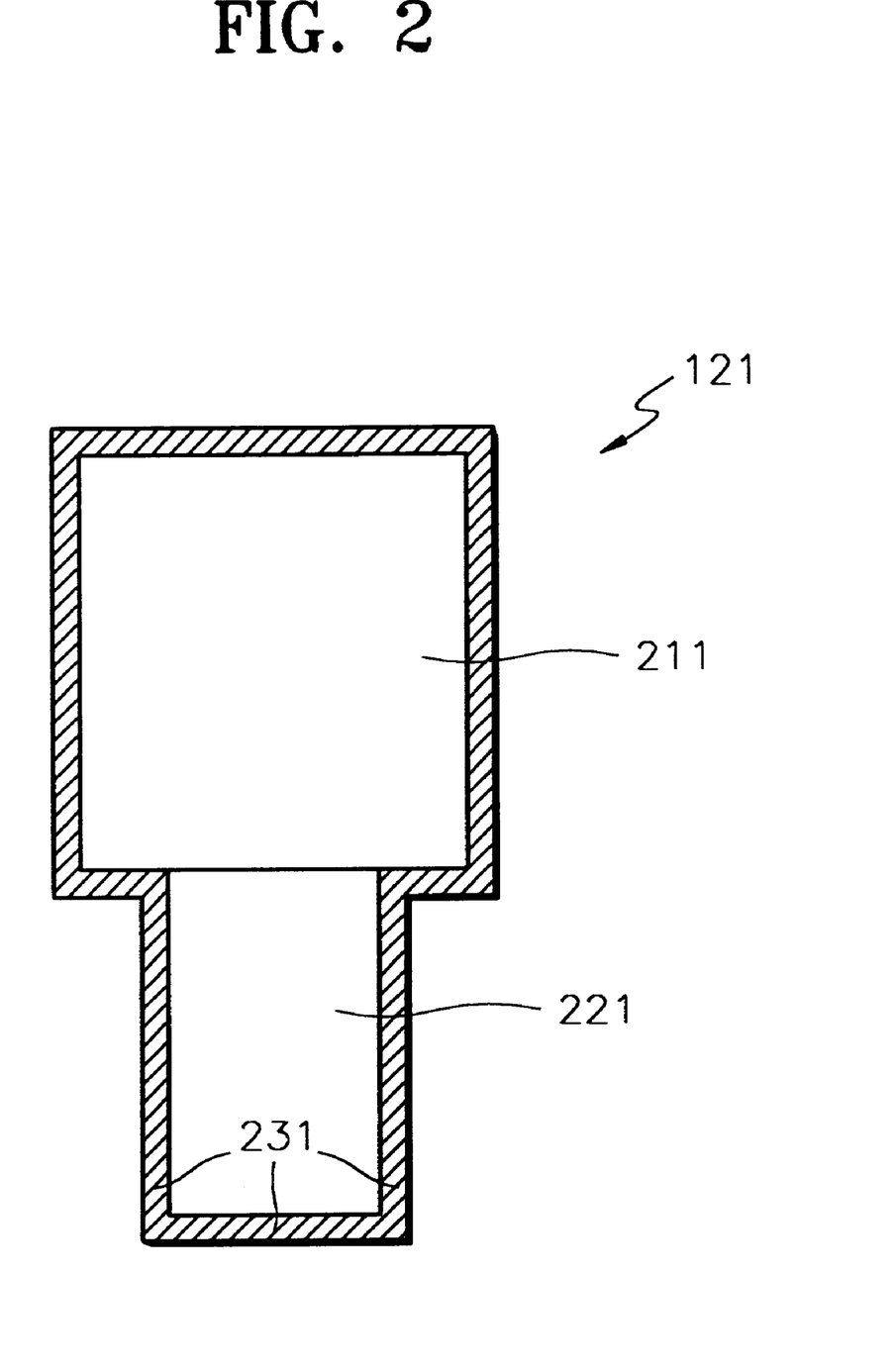
FIG. 2 is an enlarged plan view of one type of pad illustrated in FIG. 1.

FIG. 2 shows an enlarged view of one of the second pads 121. Referring to FIG. 2, The second pad 121 includes a probing portion 211 and a bonding portion 221. During testing, probe tips are brought into contact with probing portion 221. The probe tips are used to transmit a test signal generated by the memory testing equipment (not shown) to the memory cell array 131 during testing of the memory cell array 131. The probing portion 211 is made sufficiently wide so that the second pad 121 can be conveniently probed using probe tips such as those illustrated in FIG. 5 by reference character 511 during a wafer sort test. The probing portion 211 has a quadrilateral shape, for example, a rectangular shape. The peripheral edge 231 of the bonding portion 221 and probing portion 211 is covered with insulating material, for example, transparent glass. Thus, it is not bonded or probed and is protected from damage which could be caused by contact to the peripheral edge. The bonding portion 221 is bonded to a bonding wire (not shown), for example, a gold wire or an aluminum wire, which connects the second pad 121 to a lead frame (not shown). The bonding portion is not probed.

As described above, the first embodiment of the present invention relates to an integrated circuit device in which a pad, which is used during both the testing of the memory cell array 131 and the testing of the logic circuit 141, is divided into a bonding portion 221 and a probing portion 211. According to the first embodiment, the bonding portion 221 to be connected to a bonding wire is protected from physical damage which is caused by probing probe tips of the test equipment during testing, thereby avoiding bonding defects which are caused by damage on a probed pad. In addition, the bonding portion 221 and the probing portion 211 are combined into a single second pad 121 thus taking a smaller space than the prior art two-pad arrangement, thereby reducing the size of the integrated circuit device 101.

Figure 3:
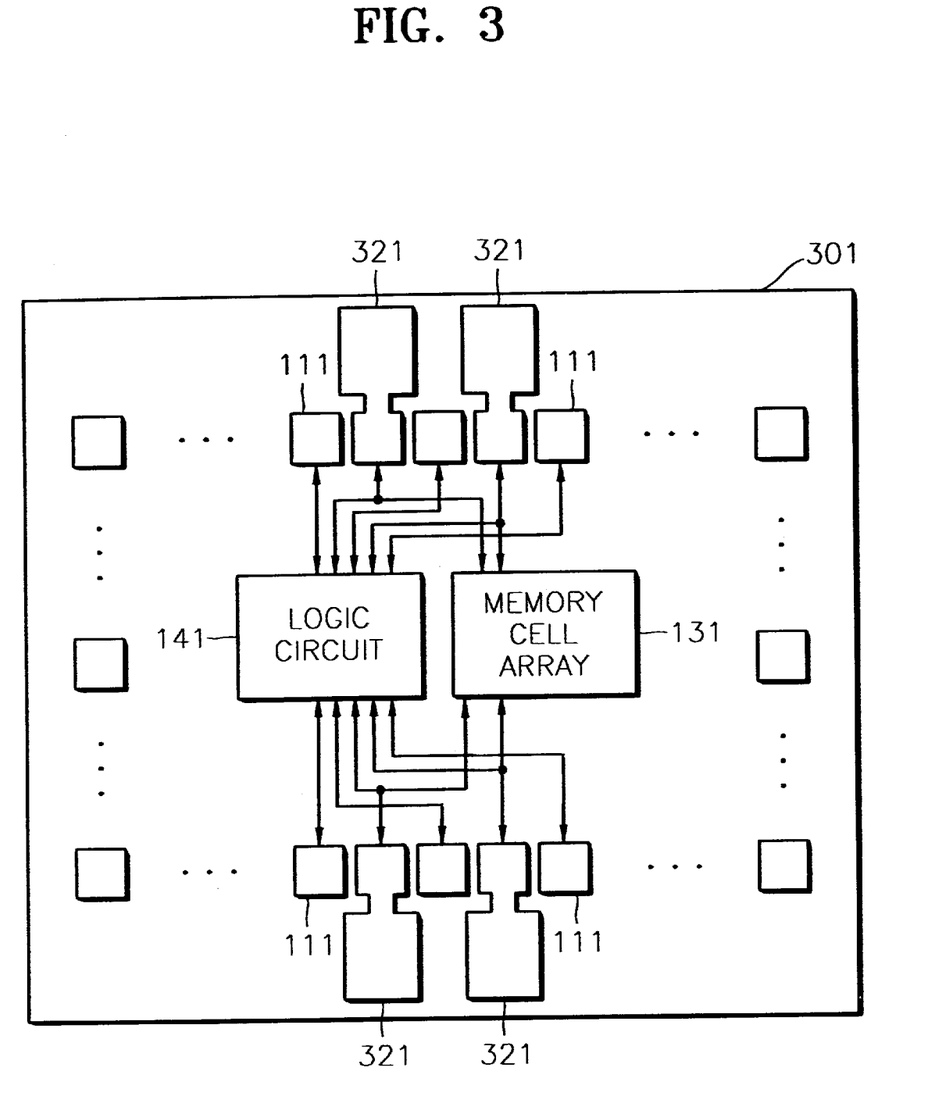
FIG. 3 is a combination block and pictorial diagram of an integrated circuit device according to a second embodiment of the present invention.

Referring to FIG. 3, an integrated circuit device 301 according to a second embodiment of the present invention includes a plurality of first pads 111, a plurality of second pads 321, a memory cell array 131 and a logic circuit 141. The first pads 111 are electrically connected to the logic circuit 141, but are not connected to the memory cell array 131. The second pads 321 are electrically connected to both the logic circuit 141 and the memory cell array 131. To selectively connect the second pads 321 to either the logic circuit 141 or the memory cell array 131, a multiplexer (not shown) is used. The second pads 321 are connected to the logic circuit 141 during a normal mode of operation and connected to the memory cell array 131 during a test mode, by the multiplexer.

During the test mode, memory testing equipment directly accesses the memory cell array 131 via the second pads 321 without passing through the logic circuit 141, thereby reducing the amount of time necessary for testing the memory cell array 131. The first pads 111 and the second pads 321 are alternately arranged. By interposing each of the first pads 111 between the second pads 321, the first and second pads 111 and 321 can be effectively arranged within a limited space. Each of the first and second pads 111 and 321 is made of ductile metal, for example, aluminum or copper alloy, and is composed of a single metal layer or a multi-metal layer. In FIG. 3, the first and second pads 111 and 321 are arranged on vertical axes, respectively, but they may be arranged on horizontal axes or on both the vertical and horizontal axes.

Figure 4:
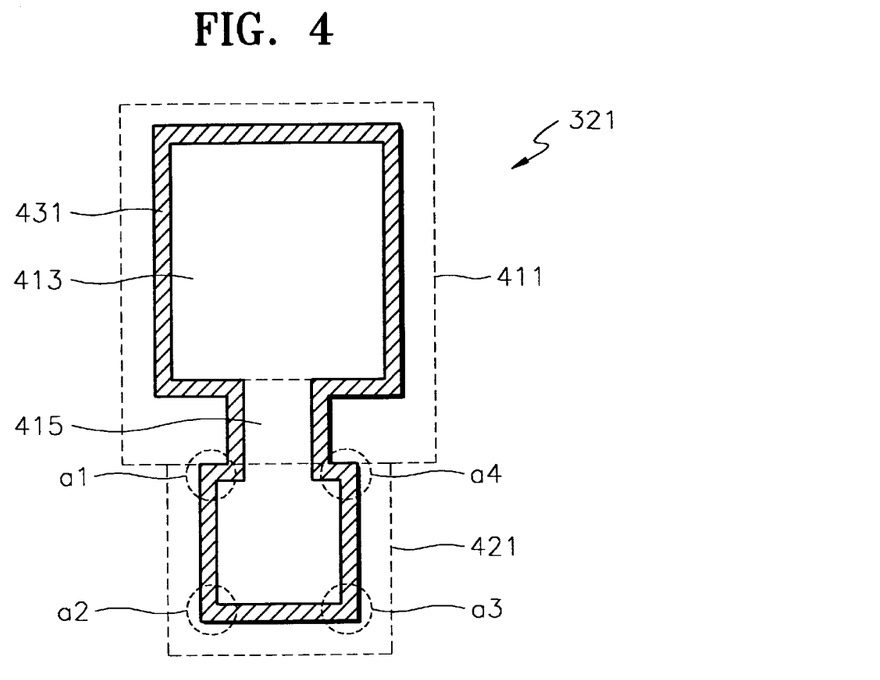
FIG. 4 is an enlarged plan view of a pad depicted in FIG. 3.

FIG. 4 shows an enlarged view of one of the second pads 321 depicted in FIG. 3. Referring to FIG. 4, The second pad 321 includes a probing portion 411 and a bonding portion 421. The bonding portion 421 is bonded to a bonding wire (not shown), for example, a gold wire or an aluminum wire, which electrically connects the integrated circuit device 301 to an external system. As illustrated in FIG. 4, bonding portion 421 has a quadrilateral shape so that its position can be automatically identified by bonding equipment (not shown). More particularly, the bonding equipment locates the bonding position by recognizing the corners a1 through a4 of the bonding portion 421, particularly, orthogonal edges of corners a1 through a4.

Figure 5:
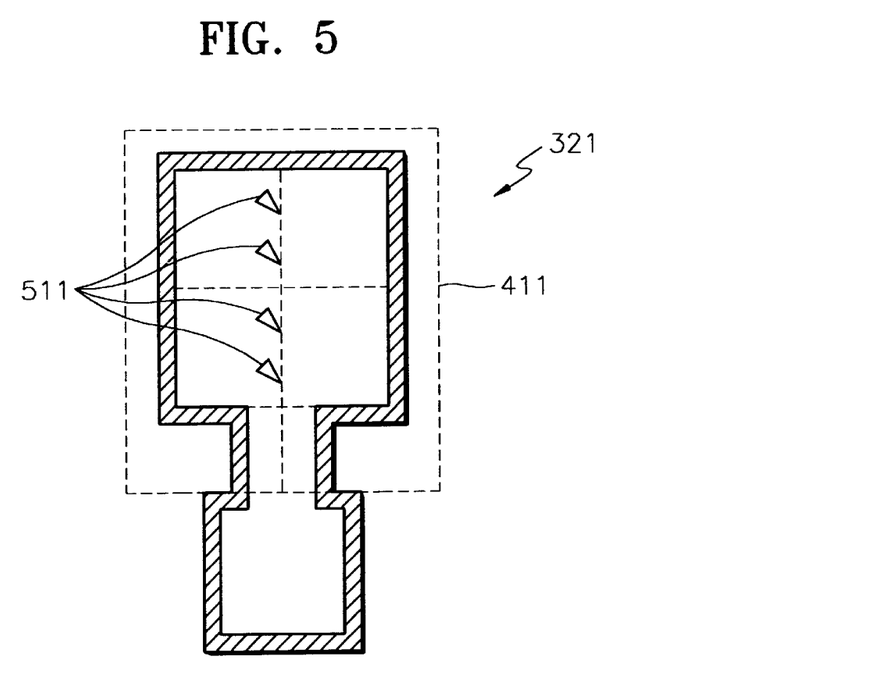
FIG. 5 is a diagram showing the locations at which probe tips impact the pad depicted in FIG. 4.

The probing portion 411 is contacted by probe tips 511 of FIG. 5, which are used for transmitting a test signal, which is generated from the memory testing equipment (not shown), to the memory cell array 131 during testing of the memory cell array 131. The probing portion 411 is divided into a first probing portion 413 and a second probing portion 415. The first probing portion 413 is constructed with a quadrilateral shape, for example, a rectangular shape. The second probing portion 415 which is disposed between the first probing portion 413 and the bonding portion 421 and also has a quadrilateral shape, but is narrower than the first probing portion 413.

The peripheral edge 431 of the bonding portion 421 and probing portion 411 is covered with insulating material, for example, transparent glass and thus, are not bonded or probed and are protected from external shock.

Referring to FIG. 5, the probing portion 411 of the second pad 321 is made sufficiently wide so that the probe tips 511 can contact many different positions on the probing portion 411 and can easily be aimed for probing of the second pad 321 during a wafer sort test. Therefore, the probing can be precisely performed.

As described above, according to the second embodiment of the present invention, even if the second pad 321 is probed multiple times, the bonding portion 421 of the second pad 321 is not contacted during the probing process and is thereby protected from physical damage caused by the probing, thus eliminating bonding defects which would be caused by damage to the pad. In addition, probing by the probe tips 511 is conveniently performed during a wafer sort test. Moreover, since the bonding portion 421 and the probing portion 411 are combined into the single second pad 321, a smaller area is required when compared to the prior art technique, thereby reducing the size of the integrated circuit device 301.

Figure 6:
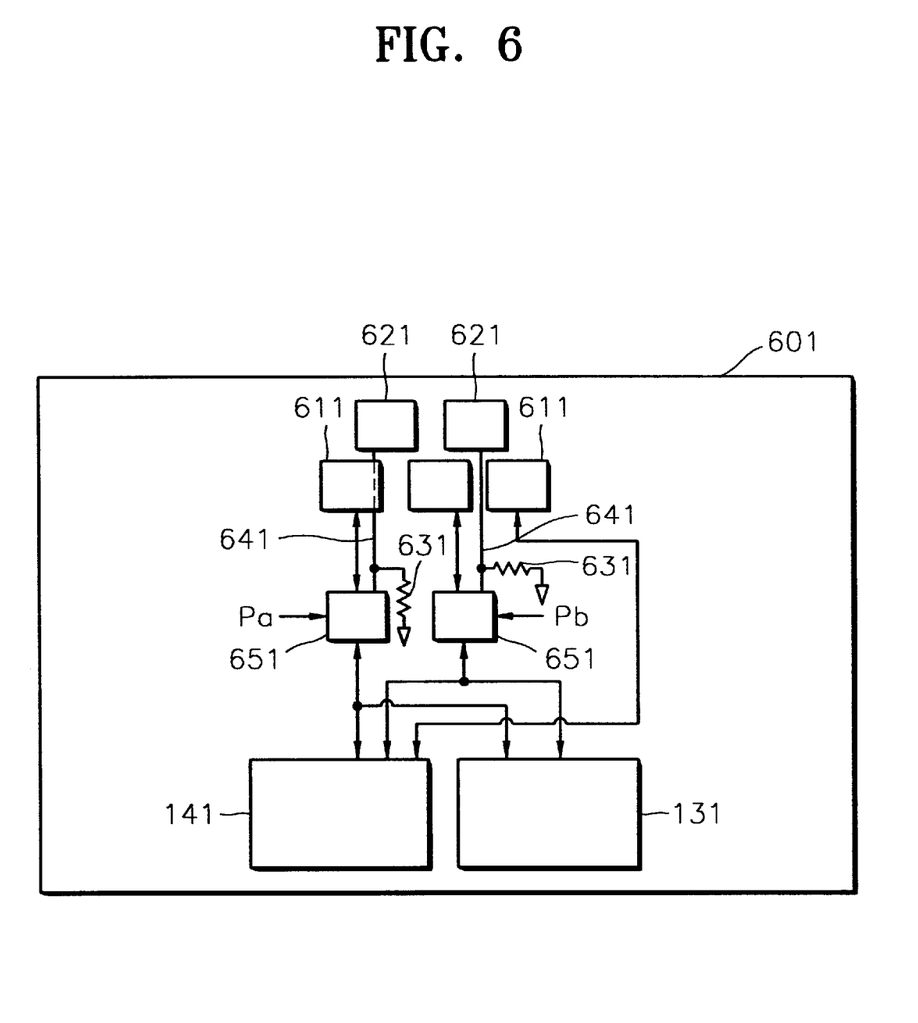
FIG. 6 is a schematic block diagram of an integrated circuit device according to a third embodiment of the present invention.

FIG. 6 is a schematic block diagram of an integrated circuit device according to a third embodiment of the present invention. Referring to FIG. 6, an integrated circuit device 601 includes a plurality of logic pads 611, a plurality of test pads 621, a memory cell array 131, a logic circuit 141, multiplexers 651 and resistors 631. The logic pads 611 are electrically connected to the logic pads 611, a plurality of test pads 621, a memory cell array 131, a logic circuit 141, multiplexers 651 and resistors 631. The logic pads 611 are electrically connected to the logic circuit 141 through the multiplexers 651 but are not connected to the memory cell array 131. The test pads 621 are electrically connected to the memory cell array 131 through the multiplexers 651 but are not connected to the logic circuit 141. The resistors 631 are connected to the test pads 621, but may be omitted. Conductive lines 642, which connect the test pads 621 to the memory cell array 131, for example, metal lines, pass between or under the logic pads 611. Each of the logic pads 611 is formed of a single metal layer or a multi-metal layer having at least two metal layers. When the conductive lines 642 pass under the logic pads 611, each of the logic pads 611 is formed of at least three metal layers. The structure of each logic pad 611 and the conductive lines 642, will be described in detail with reference to FIG. 7.

Pull-up resistors or pull-down resistors 631 are used according to characteristics of signals, which are applied to the test pads 621. In response to control signals Pa and Pb which are generated within the integrated circuit device 601, the multiplexers 651 selectively transmit signals, which are input from the outside via the logic pads 611 and the test pads 621, to the logic circuit 141 or the memory cell array 131, and selectively transmits signals, which are generated from the logic circuit 141 or the memory cell array 131, to the logic pads 611 or the test pads 621.

Figure 7:
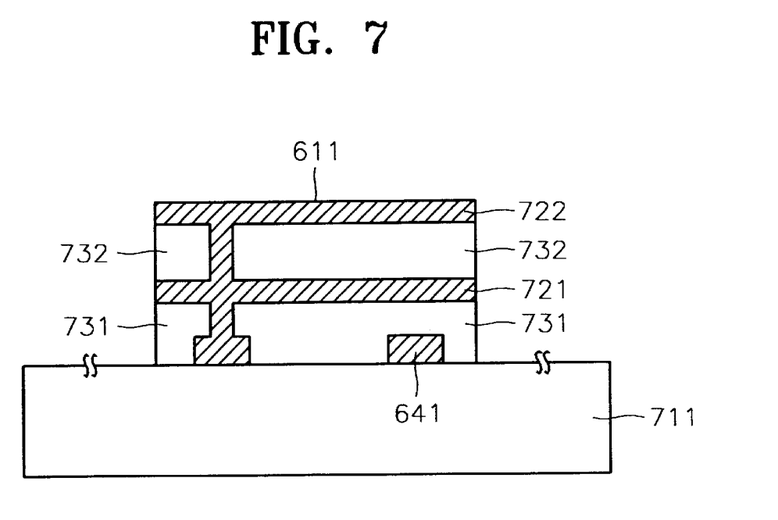
FIG. 7 is a sectional view taken along line 7—7 of FIG. 6 showing a conductive line, a substrate and a logic pad depicted in FIG. 6, in which the logic pad is formed of a multi-metal layer.

FIG. 7 is a sectional view taken along line 7—7 of FIG. 6 and illustrates a structure including one of the logic pads 611 and one of the conductive lines 642 depicted in FIG. 6, and a substrate 711. In FIG. 7, the logic pad 611 is formed of a multi-metal layer. Referring to FIG. 7, the logic pad 611 is composed of metal layers 721 and 722, and insulating layers 731 and 732 on the substrate 711 of the integrated circuit device 601. The conductive line 642 passes between the metal layer 721 and the substrate 711. Alternatively, the conductive line 642 may pass between the metal layers 721 and 722 depending on the design requirements of the conductive line 642. The logic pad 611 may be formed of three or more metal layers according to the characteristics of the integrated circuit device 601. Since the conductive line 642 passes between the logic pads 611 (as illustrated in FIG. 6), or passes beneath the logic pad 611, the spacing between the logic pads 611 can be narrower, thereby minimizing the size of the integrated circuit device 601 even with the addition of the test pads 621.

Figure 8:
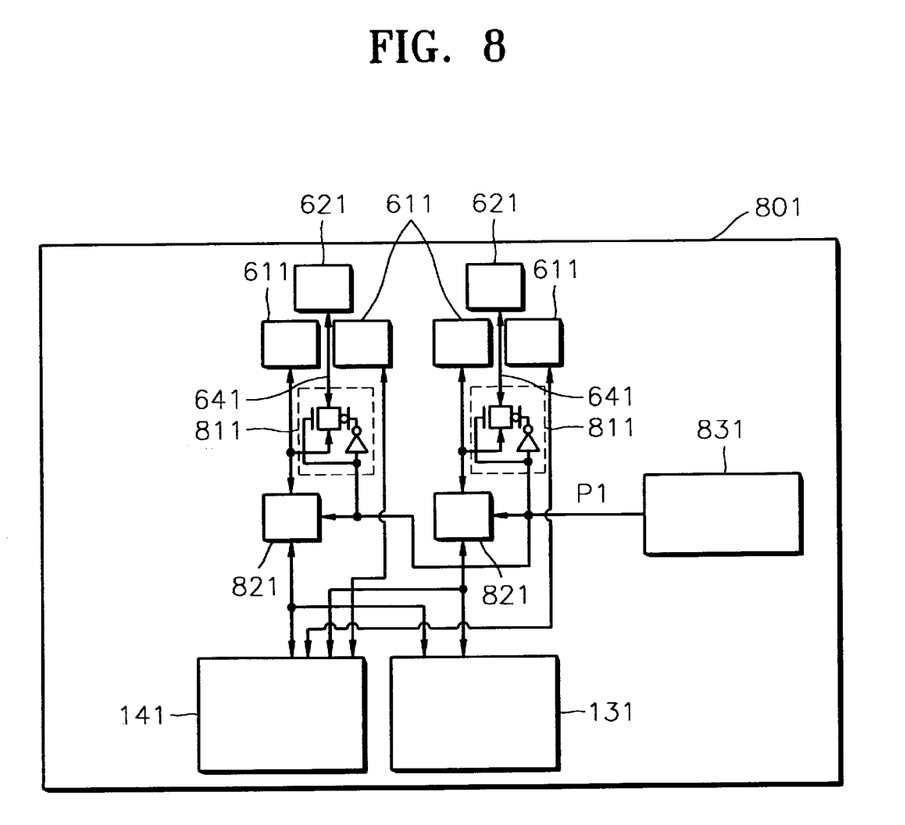
FIG. 8 is a schematic block diagram of an integrated circuit device according to a fourth embodiment of the present invention.

FIG. 8 is a schematic block diagram of an integrated circuit device according to a fourth embodiment of the present invention. Referring to FIG. 8, an integrated circuit device 801 includes a plurality of logic pads 611, a plurality of test pads 621, a memory cell array 131, a logic circuit 141, a plurality of multiplexers 821, a plurality of transmitting means 811 and a test controller 831. The logic pads 611 are electrically connected to the multiplexers 821. The multiplexers 821 are electrically connected to the logic circuit 141 and the memory cell array 131. During a test mode, the test controller 831 generates a signal P1 to control the transmitting means 811 and the multiplexers 821. The transmitting means 811, for example, transmission gates, are connected to the test pads 621. Once the signal P1 is activated to, for example, a logic high, the transmitting means 811 are activated and transmit test signals from the test pads 621 to the multiplexers 821. The multiplexers 821 are activated when the signal P1 is activated, and deactivated when the signal P1 is deactivated. However, the multiplexers 821 may be configured to operate conversely according to the design of a circuit. Once the multiplexers 821 are activated, the test signals passing through the transmitting means 811 are transmitted to the memory cell array 131 via the multiplexers 821. A signal which is generated from the memory cell array 131 is transmitted to the test pads 621 via the multiplexers 821 and the transmitting means 811 when the multiplexers 821 and the transmitting means 811 are activated.

During a normal mode, the signal P1 is deactivated. When the signal P1 is deactivated, the transmitting means 811 are also deactivated. Accordingly, only external signals passing through the logic pads 611 are transmitted to the multiplexers 821, or directly to the logic circuit 141 via a path which does not include multiplexers 821, and the multiplexers 821 transmit the external signals received from the logic pads 611 to the logic circuit 141. A signal which is generated from the logic circuit 141 is transmitted to only the logic pads 611 via the multiplexers 821 or directly to the logic pads 611.

By design, the transmitting means 811 and the multiplexers 821 occupy only a small space. The test controller 831 is designed to control the transmitting means 811 and the multiplexers 821. Accordingly, the transmitting means 811, the multiplexers 821 and the test controller 831 do not occupy a large area. In addition, the conductive lines 641, which connect the test pads 621 to the memory cell array 131, are designed to pass between the logic pads 611 or pass beneath the logic pads 611 as shown in FIG. 7 so that the size of the integrated circuit device 801 is not increased.

According to one aspect of the present invention as described above, pads are provided for testing a memory cell array, the pads including a bonding portion and a probing portion. During testing only the probing portions are contacted by the test probes which avoids damaging the bonding portion and ensures the integrity of wire bonds to the bonding portion even if each probing portion is probed by probe tips multiple times. According to another aspect of the present invention, conductive lines which are utilized during testing may pass between logic pads or pass beneath logic pads to minimize the increase in size of a chip, which would otherwise be caused by addition of pads for testing.

While this invention has been particularly shown and described with reference to preferred embodiments thereof, it will be understood by those skilled in the art that various changes in form and details may be made therein without departing from the spirit and scope of the invention as defined by the appended claims.

We claim:

1. An integrated circuit device including a substrate having a memory cell array and a logic circuit, the integrated circuit device comprising:
    a logic pad positioned on said substrate;
    a test pad positioned on said substrate;
    a multiplexer electrically connected to the logic pad, the test pad, the memory cell array and the logic circuit, the multiplexer being adapted to receive a control signal having first and second states, said multiplexer responding to receipt of a control signal of said first state to couple the logic pad to the logic circuit, and said multiplexer responding to receipt of a control signal of said second state to couple the test pad to the memory cell array; and
    a resistor connected to the test pad.

2. The integrated circuit device of claim 1, wherein the logic pad comprises a metal layer having a portion positioned above a surface of the substrate, the portion having an area; and wherein said device further includes a conductive line connecting the test pad to the multiplexer, and further wherein a portion of said conductive line is positioned within the area.

3. The integrated circuit device of claim 1, wherein said device further includes a conductive line connecting the test pad to the multiplexer, and wherein a portion of the conductive line is adjacent to a portion of the logic pad.

4. The integrated circuit device of claim 1, wherein said integrated circuit device includes a plurality of logic pads and plurality of test pads.

5. An integrated circuit device having a memory cell array and a logic circuit, the integrated circuit device comprising:
    a logic pad;
    a test pad;
    transmitting means electrically connected to the test pad, said transmitting means including an input for receiving a control signal, and said transmitting means including an output for providing thereat a signal received from the test pad when the control signal is activated; and
    a multiplexer electrically connected to the logic pad, to the transmitting means, to the memory cell array and to the logic circuit, said multiplexer including an input for receiving the control signal, said multiplexer being responsive to receipt of the control signal to transmit a signal received from the logic pad to the logic circuit, and to transmit a signal received from the test pad to the memory cell array.

6. The integrated circuit device of claim 5, wherein the logic pad comprises a metal layer having a portion positioned above a surface of the substrate, the portion having an area; and wherein said device further includes a conductive line connecting the test pad to the multiplexer, and further wherein a portion of said conductive line is positioned within the area.

7. The integrated circuit device of claim 5, wherein said device further includes a conductive line connecting the test pad to the multiplexer, and wherein a portion of the conductive line is adjacent to a portion of the logic pad.

8. The integrated circuit device of claim 5, wherein said integrated circuit device includes a plurality of logic pads, a plurality of test pads, a plurality of transmitting means and a plurality of multiplexers.

9. The integrated circuit device of claim 8, further comprising a test controller for generating and providing at an output the control signal for controlling the plurality of transmitting means and the plurality of multiplexers.

* * * * *